United States Patent [19]

Boccalon et al.

[11] Patent Number: 4,814,199

[45] Date of Patent: Mar. 21, 1989

[54] PROCESS FOR PREPARING METALLIZABLE POLYOLEFIN FILMS

[75] Inventors: Gianfranco Boccalon, Monterotondo; Rocco Costantino, Rome; Antonio Zanobi, Monterotondo, all of Italy

[73] Assignees: Eniricerche S.p.A., Milan; Enichem Anic S.p.A., Palermo, both of Italy

[21] Appl. No.: 189,658

[22] Filed: May 3, 1988

[30] Foreign Application Priority Data

May 5, 1987 [IT]  Italy ................................ 20371 A/87

[51] Int. Cl.$^4$ .............................................. B05D 3/06
[52] U.S. Cl. ...................................... 427/38; 427/322; 427/331
[58] Field of Search .......................... 427/38, 322, 331

Primary Examiner—Bernard Pianalto
Attorney, Agent, or Firm—Hedman, Gibson, Costigan & Hoare

[57] ABSTRACT

Metallizable, thermoweldable polyolefin films, endowed with good gas-barrier properties, are obtained by means of a process which comprises the following steps, carried out in sequence:

(a) treatment of the surface of the film with an argon plasma;
(b) deposition of a thin layer of liquid alkoxy-silanes on the surface of the so-treated film;
(c) treatment of the alkoxy-silane coated film with an argon-oxygen plasma.

20 Claims, No Drawings

PROCESS FOR PREPARING METALLIZABLE POLYOLEFIN FILMS

The present invention relates to a process for preparing metallizable, thermoweldable polyolefin films endowed with good barrier properties.

It is known in fact that poliolefins, and, in particular, polyethylene, show very poor gas barrier properties, and are very difficult to metallize, owing to their chemical inertness and to the roughness and porosity of the films obtained from them.

In order to overcome such difficulties, usually a film surface treatment is carried out, to the so treated surface a primer layer is applied, and the film surface is finally submitted to the metallization.

For example, it is known to treat the polyolefin film surface with electrical discharges, a flame or oxidizing chemical agents, and apply to it, as a primer, an aminic compound, e.g., polyethyleneimine, polyhydroxy alkoxyalkylmelamines, or products deriving from urea-formaldehyde condensation, as disclosed in Italian Patent Nos. 1,137,466 and 1,136,628.

But such primers do not contribute, per se, to improve the gas barrier properties, and, furthermore, the adhesion of a metal to the so-treated film results not very satisfactory.

Still according to the prior art, it is possible to apply to the polyolefin film a coating of polysiloxane type, as disclosed, e.g., in JP-73/14662, which is chemically more affine to the metal than the a polar surface of the substrate.

The adhesion of such a coating to polyolefin film, in particular to polyethylene, shows however many difficulties, owing to the poor wettability and to the low cohesion force of the surface layer of the same polyolefin.

The above mentioned Japanese patent uses for applying the polysiloxane coating the plasma-polymerization technique, by means of which the silanes can be polymerized and simultaneously deposited from the gas phase.

However, when one operates in this way, the yield of conversion of silanes into polysiloxane polymer results very low, and leads to a large waste of reactant, rendering the process unfeasible from an economic standpoint.

Furthermore, after the metallization, the film shows not very satisfactory characteristics as to the adhesion strength of the metal to the polysiloxane coating.

The present applicant has found now that the disadvantages of the prior art can be overcome, and a polyolefin film can be prepared, which can be easily metallized, is thermoweldable, is endowed with good gas barrier properties, by means of a process which comprises the following steps carried out in sequence:

(a) treatment of the film surface with an argon plasma, until a wettability equal to, or larger than, 40 dynes/cm (ASTM D-2578) is obtained;

(b) deposition on the so-treated film surface of at least one liquid alkoxysilane, having the formula:

$$R^{I}-\underset{|}{Si}-(OR)_{3-n} \quad\quad (I)$$
$$\overset{(R^{II})_n}{}$$

wherein:
n=0, 1, 2;

$R^I$ is a saturated or unsaturated hydrocarbyl group containing from 1 to 5 carbon atoms, or is an aminoalkyl group containing from 1 to 5 carbon atoms;

R is an alkyl group of from 1 to 4 carbon atoms;

$R^{II}$ is hydrogen, halogen, an alkyl group containing from 1 to 4 carbon atoms, or is OR;

in an amount of from 0.3 to 2.25 g/m², and, finally (c) treatment of the so coated film with an argon-oxygen plasma, until at least 90% of the I.R. absorption band relevant to OR groups disappears.

The suitable polyolefins for preparing the film to be treated according to the process of the present invention are low, medium and high-density polyethylene, and polypropylene. Particularly preferred is linear, low-density polyethylene (LLPDE).

The films have a thickness comprised within the range of from 20 to 140 microns and, in the preferred form of practical embodiment, they are polyethylene films of 40–50 microns of thickness, and polypropylene films of 20–30 microns of thickness, either mono-axially or bi-axially stretched.

According to the process of the present invention, in the (a) step the treatment with argon plasma is carried out until wettability values of from 40 to 90 dynes/cm are obtained.

A further effect of the treatment with an argon plasma is that which causes the polyolefin to crosslink at the surface layer level, which becomes hence much more compact and homogeneous.

The percentage of crosslinked polymer, measured by means of an extraction process carried out in Soxhlet with boiling para-xylene, is comprised within the range of from 0.05 to 0.2% by weight relatively to the initial film, and is preferably comprised within the range of from 0.08 to 0.17% by weight.

In order to carry out the treatment of the (a) step, the process is advantageously performed under an argon pressure comprised within the range of from $10^{-2}$ to 0.3 mm$_{Hg}$, with a power of the electrical discharge comprised within the range of from 15 to 100 Watts, for a time of from 5 seconds to 7 minutes.

According to the (b) step of the process of the present invention, on the surface of the film a layer is then deposited, which is constituted by at least one alkoxysilane falling within the scope of formula (I).

Some examples of alkoxysilanes used for the intended purpose are: 3-aminopropyl-trimethoxysilane; 3-aminopropyl-triethoxysilane; 3-aminopropyl-methyl-diethoxysilane; vinyl-trimethoxysilane; vinyl-triethoxysilane; methyltrimethoxysilane.

In particular, mixtures 3-aminopropyltriethoxysilane with vinyl-triethoxysilane are preferred, and particularly preferred are those mixtures in which the mutual ratio of said two alkoxysilanes is of 1.1 by volume.

The amount of alkoxysilanes deposited on the surface of the polyolefinic film is comprised within the range of from 0.3 to 2.25 g/m², and, preferably, of from 0.7 to 1.5 g/m².

The deposition of the alkoxysilanes is usually carried out by spreading, possibly using solutions of said silanes in solvents of either hydrocarbon or alcoholic type.

The solvent, which has the purpose of facilitating the spreading of the alkoxysilanes on the surface of the film, must be volatile under the conditions of the (c) step treatment, so that it can be completely removed.

Acording to a preferred form of practical embodiment of the present invention, solutions of 3-aminopropyl-triethoxysilane and vinyl-triethoxysilane in isopropanol are used.

Once that the alkoxysilanes are deposited on the surface of the polyolefin, the so coated film is submitted to the treatment with the argon-oxygen plasma (the (c) step), so as to transform the liquid alkoxysilanes into a crosslinked and adherent coating.

The treatment of this step according to the present invention is carried out until the I.R. absorption band relevant to OR groups disappears, or at least until 90% of said band disappears.

The crosslinking of the alkoxysilanes is obtained by operating under a pressure comprised within the range of from 0.05 to 0.5 $mm_{Hg}$, using an argon/oxygen mixture with a ratio comprised within the range of from 5:1 by volume to 20:1 by volume, operating with a power of the electrical discharge comprised within the range of from 20 to 150 watts, for a time of from 30 seconds to 7 minutes.

The so obtained coating has a thickness comprised within the range of from 0.2 to 1.5 microns, and preferably of from 0.8 to 1.2 microns.

It is completely clear and, thanks to its high crosslinking degree, is highly uniform, compact and free from pores.

The adhesion to the polyolefin, evaluated according to ASTM D-2141 method, is strong and long-lasting.

The polyolefin films to which such a coating is applied can be easily inked with an ink having a surface tension higher than 50 dynes/cm, and are thermoweldable, which makes them suitable for a wide use in the packaging field.

Particularly attractive, in view of an industrial application in the field of food packaging, are the barrier properties of the obtained films and, in particular, their oxygen-barrier properties.

The films obtained by means of the process of the present invention show in fact an oxygen transmission, measured with the LYSSY, Gas Permeability Tester L100, equipment, in accordance with ASTM D-1434 standard, which is approximately 10 times lower than that of an untreated polyolefin film.

A polyethylene film, e.g., after the treatment according to the (a), (b) and (c) steps of the present invention, shows an oxygen transmission lower than 400 cc/$m^2$/24 hrs/atm, as compared to the value of approximately 4,000 cc/$m^2$/24 hrs/atm of polyethylene as such.

The barrier properties are further improved if the film is metallized, e.g. with aluminum, in correspondence of the polysiloxane layer.

The metallization can be carried out according to any of the vacuum-metallization techniques known from the prior art, such as, e.g., the sputtering, or the technique of deposition by evaporation.

The metal coating which is obtained has a thickness comprised within the range of from 0.06 to 5 microns, and results uniform and perfectly adherent. In fact, by submitting the metallized film to the peeling test with adhesive tape, after 10 peelings no detachments of any metal particles from the film surface are experienced yet.

The metallized polyolefin films show values of oxygen transmission comprised within the range of from 50 to 200 cc/$m^2$/24 hrs/atm; this property makes them suitable for use in the field of foodstuff packaging.

The following examples are illustrative, and they should not be construed as being limitative of the invention.

EXAMPLE 1

A film of linear, low-density polyethylene is used, which has a thickness of 50 microns, a density of 0.919 g/$cm^3$, a melt index of 0.70, and contains 15% of low-density polyethylene.

The plasma generating equipment consists of a generator of a 13.56-MHz radiofrequency, which feeds an induction coil wound around a cylindrical glass chamber.

The film is placed inside said cylindrical chamber and is treated, in correspondence of one of its surfaces, with an argon plasma, generated by maintaining the pressure of the same argon at 0.150 $mm_{HG}$, and operating with a discharge power of 60 Watts, for a 5-minute time.

Under such conditions, the polyethylene film reaches a wettability of 40 dynes/cm (ASTM D-2598 Method), and a percentage of crosslinked polymer of 0.130%.

To only the so-treated surface of the film, a mixture of 3-aminopropyl-triethoxysilane (a commercial product by Fluka AG) and vinyl-triethoxysilane (a commercial product by Fluka AG) in the ratio of 1:1 by volume, is applied by spreading.

The so-coated linear, low-density polyethylene film is submitted to a treatment with an argon-oxygen plasma, under a pressure of 0.150 $mm_{Hg}$, with a ratio of argon to oxygen of 19:1 by volume, by operating with a discharge power of 20 Watts, for a time of 5 minutes.

The so obtained coating has a thickness of 1.2 microns, as measured by the ATR-FTIR technique, by measuring the decrease in absorbance of the band at 730 $cm^{-1}$ (relevant to polyethylene -$CH_2$- groups) of the film coated with the polysiloxane coating, relatively to the absorbance of non-coated polyethylene.

The adhesion of the polysiloxane coating, measured by the ASTM D-2141 method, has a value of 100%.

The oxygen transmission by said coated polyethylene film, measured by the ASTM D-1434 Method, is of 175 cc/$m^2$/24 hrs/atm.

Such a film, coated with the polysiloxane film, is then metallized with aluminum, by using the Magnetron Sputtering technique, under the following conditions:

Incident power: 50 Watts;
Pressure during the discharge: $1.5 \times 10^{-3}$ $mm_{Hg}$;
Sputtering time: 10 minutes:
Argon flow rate: 20 sccm;
Al thickness: 600 Å;

The metal coating obtained has a uniform appearance, and an adhesion of 100%.

The linear, low-density polyethylene film metallized with 600 Å of aluminum shows an oxygen transmission of 95 cc/$m^2$/24 hrs/atm.

EXAMPLE 2

Like in Example 1, a film of linear, low-density polyethylene is used, which has the same physical -chemical characteristics.

In this case, said film is treated, in correspondence of both the surfaces thereof, with an argon plasma, under an argon pressure of 0.500 $mm_{Hg}$, with a discharge power of 100 watts, for a time of 2 minutes and 30 seconds.

Under such conditions, a wettability of 46 dynes/cm and a percentage of crosslinked polymer of 0.145% are reached.

Like in Example 1, to the so-treated polyethyene film surface, a mixture of 3-aminopropyl-triethoxysilane and vinyltriethoxysilane in the ratio of 1:1 by volume, is applied by spreading.

The film is then submitted to a treatment with an argon-oxygen plasma, under a pressure of 0.150 mm$_{Hg}$, with a ratio of argon to oxygen of 7:1 by volume, by operating with a power of the electrical discharge of 60 Watts, for a time of 5 minutes.

The thickness of the so obtained polysiloxane coating is of 1.5 microns, and the adhesion thereof is of 100%.

The oxygen transmission of said coated polyethylene film, is of 280 cc/m$^2$/24 hrs/atm.

The polyethylene film with the polysiloxane coating is then metallized with aluminum, by using the Magnetron Sputtering technique, under the same conditions as of Example 1.

The adhesion of the metal layer is identical to that as of Example 1, and the oxygen transmission of the metallized polyethylene film is of 110 cc/m$^2$/24 hrs/atm.

EXAMPLE 3

The process is carried out like in Example 1, by using a film polyethylene having the same physical-chemical characteristics, and carrying out a treatment with an argon plasma, under the same operating conditions.

The effect of such a treatment on the wettability and on the percentage of crosslinked polymer is the same as of Example 1.

To the surface of the polyethylene film treated with the argon plasma, a mixture of 3-aminopropyltriethoxysilane and vinyl-triethoxysilane diluted with isopropyl alcohol (a commercial product by Carlo Erba), with the volume ratio of the three components being of 1:1:1, is then applied by spreading.

The polyethylene film coated with such a mixture is then submitted to a treatment with an argon-oxygen plasma, under a pressure of 0.150 mm$_{Hg}$, with the ratio of said gases to each other being of 6:1 by volume, by operating with an electrical discharge of 60 Watts of power, for a time of 5 minutes.

The thickness of the polysiloxane coating obtained after such a treatment is of 1.2 microns, and the adhesion thereof to the polyolefin is identical to that as of Example 1.

The oxygen transmission of such film, is of 390 cc/m$^2$/24 hrs/atm.

The film of low-density, linear polyethylene with the polysiloxane coating is then metallized with aluminum, by using the Magnetron Sputtering technique, under the following conditions:

Incident power: 50 Watts;
Pressure during the discharge: 5.5×10$^{-3}$ mm$_{Hg}$;
Sputtering time: 12 minutes:
Argon flow rate: 20 sccm;
Al thickness: 800 Å;

The aluminum coating shows an adhesion to the substrate identical to that as of Example 1, and the oxygen transmission of the metallized polyethylene film is of 160 cc/m$^2$/24 hrs/atm.

EXAMPLES 4-5

For comparative purposes, samples of polyethylene film treated in an argon plasma, like in Examples 1-2, are metallized with aluminum, with the spreading of the silanes being omitted.

The wettability of said films, and their contents of crosslinked material are the same as of Examples 1-2.

The absence of the silane coating renders ineffectual the metallization for the purpose of improving the oxygen barrier property.

In fact, the oxygen transmission of the samples, after the metallization, is still very high, as it results from the following Table.

TABLE 1

| Example No. | Power of the Electrical Discharge (Watts) | Wettability (dynes/cm) | Crosslinked Material (%) | Oxygen Transmission after Metallization cc/m$^2$/24 hrs/atm |
|---|---|---|---|---|
| Ex. 4 | 60 | 40 | 0.13 | 1,920 |
| Ex. 5 | 100 | 46 | 0.145 | 1,950 |

We claim:

1. Process for preparing metallizable, thermoweldable polyolefin films endowed with barrier properties, characterized in that it comprises the following steps carried out in sequence:
   (a) treatment of the film surface with an argon plasma, until a wettability equal to, or larger than, 40 dynes/cm is obtained;
   (b) deposition on the so-treated film surface of at least one liquid alkoxysilane, having the formula:

wherein:
   n=0, 1, 2;
   R is an alkyl group containing from 1 to 4 carbon atoms;
   R$^I$ is a saturated or unsaturated hydrocarbyl group containing from 1 to 5 carbon atoms, or is an aminoalkyl group containing from 1 to 5 carbon atoms;
   R$^{II}$ is hydrogen, halogen, a hydrocarbyl group containing from 1 to 4 carbon atoms, or is OR;
   in an amount of from 0.3 to 2.25 g/m$^2$, and, finally
   (c) treatment of the so coated film with an argon-oxygen plasma, until at least 90% of the I.R. absorption band relevant to OR groups disappears.

2. Process according to claim 1, characterized in that low, medium and high-density polyethylene films and polypropylene films are used.

3. Process according to claim 2, characterized in that linear, low-density polyethylene films are used.

4. Process according to claim 1, characterized in that the films have a thickness comprised within the range of from 20 to 140 microns.

5. Process according to claim 4, characterized in that polyethylene films are used, which have a thickness of 40–50 microns, and polypropylene films are used, which have a thickness of 20–30 microns, either mono-axially or bi-axially stretched.

6. Process according to claim 1, characterized in that in the (a) step the treatment with argon plasma is carried out until wettability values of from 40 to 90 dynes/cm are obtained.

7. Process according to claim 1, characterized in that by means of the treatment of the (a) step, a percentage of crosslinked polyolefin film is obtained, which is comprised within the range of from 0.05 to 0.2% by weight relatively to the non-treated film.

8. Process according to claim 7, characterized in that the percentage of crosslinked polyolefin film is comprised within the range of from 0.08 to 0.17% by weight.

9. Process according to claim 1, characterized in that in the (a) step, the process is carried out under an argon pressure comprised within the range of from $10^{-2}$ to 0.3 $mm_{Hg}$, with a power of the electrical discharge comprised within the range of from 15 to 100 Watts, for a time of from 5 seconds to 7 minutes.

10. Process according to claim 1, characterized in that in the (b) step the deposited alkoxysilanes are:
- 3-aminopropyl-triethoxysilane;
- 3-aminopropyl-triethoxysilane;
- 3-aminopropyl-methyl-diethoxysilane;
- vinyltrimethoxysilane;
- vinyl-triethoxysilane.

11. Process according to claim 10, characterized in that mixtures of 3-aminopropyl-triethoxysilane with vinyl-triethoxysilane are deposited.

12. Process according to claim 11, characterized in that the ratio of 3-aminopropyl-triethoxysilane to vinyl-triethoxysilane is of 1.1 by volume.

13. Process according to claim 1, characterized in that the alkoxysilanes are dissolved in a hydrocarbon or alcoholic solvent.

14. Process according to claim 1, characterized in that in the (b) step the alkoxysilanes are deposited by spreading.

15. Process according to claim 1, characterized in that the amount of deposited alkoxysilanes is comprised within the range of from 0.7 to 1.5 $g/m^2$.

16. Process according to claim 1, characterized in that in the (c) step, the treatment with argon-oxygen plasma is carried out until the total disappearance of the I.R. absorption band relevant to OR groups.

17. Process according to claim 1, characterized in that in the (c) step the volume ratio of argon to oxygen is comprised within the range of from 5:1 to 20:1.

18. Process according to claim 1, characterized in that in the (c) step the process is carried out under a pressure comprised within the range of from 0.05 to 0.5 $mm_{Hg}$, with a power of the electrical discharge of from 20 to 150 Watts, for a time comprised within the range of from 30 seconds to 7 minutes.

19. Process according to claim 1, characterized in that at the end of the (c) step, a polysiloxane coating is obtained, which has a thickness comprised within the range of from 0.2 to 1.5 microns.

20. Process according to claim 19, characterized in that the thickness of the coating is comprised within the range of from 0.5 to 1.2 microns.

* * * * *